(12) United States Patent
Kim et al.

(10) Patent No.: US 9,680,447 B2
(45) Date of Patent: Jun. 13, 2017

(54) SAW FILTER HAVING GROUND TERMINALS SEPARATED

(71) Applicant: WISOL CO., LTD., Osan-si, Gyeonggi-do (KR)

(72) Inventors: Kyung Sik Kim, Osan-si (KR); Woo Hyun Kim, Osan-si (KR)

(73) Assignee: WISOL CO., LTD., Osan-si, Gyeonggi-Do (KR)

( * ) Notice: Subject to any disclaimer, the term of this patent is extended or adjusted under 35 U.S.C. 154(b) by 76 days.

(21) Appl. No.: 14/863,518

(22) Filed: Sep. 24, 2015

(65) Prior Publication Data

US 2016/0094200 A1    Mar. 31, 2016

(30) Foreign Application Priority Data

Sep. 26, 2014 (KR) .................. 10-2014-0129199
Oct. 6, 2014 (KR) .................. 10-2014-0134455

(51) Int. Cl.
*H03H 9/64* (2006.01)
*H03H 9/02* (2006.01)

(52) U.S. Cl.
CPC ...... *H03H 9/6456* (2013.01); *H03H 9/02992* (2013.01); *H03H 9/6493* (2013.01)

(58) Field of Classification Search
CPC ........... H03H 9/02874; H03H 9/02905; H03H 9/02913; H03H 9/02992; H03H 9/6433; H03H 9/6436; H03H 9/644; H03H 9/6456; H03H 9/6463; H03H 9/6466; H03H 9/6493
USPC .................. 333/193, 195; 310/313 B, 313 D
See application file for complete search history.

(56) References Cited

U.S. PATENT DOCUMENTS

| | | | | |
|---|---|---|---|---|
| 6,271,739 B1 * | 8/2001 | Ueda | ................... | H03H 9/0038 310/313 B |
| 6,469,593 B2 * | 10/2002 | Nishizawa | ........... | H03H 9/0061 310/313 R |
| 7,283,016 B2 * | 10/2007 | Haruta | ................. | H03H 9/0071 333/133 |

FOREIGN PATENT DOCUMENTS

| | | | |
|---|---|---|---|
| JP | 63-111713 A | * | 5/1988 |
| JP | 05-110377 A | * | 4/1993 |
| JP | 05-167387 A | * | 7/1993 |
| JP | 11-234081 | * | 8/1999 |
| JP | 2010-062873 A | * | 3/2010 |

(Continued)

OTHER PUBLICATIONS

English language machine translation of KR 10-2013-0125579, published Nov. 19, 2013, pp. 1-16 of 17 pages provided.*

(Continued)

*Primary Examiner* — Barbara Summons
(74) *Attorney, Agent, or Firm* — LRK Patent Law Firm (57) ABSTRACT

A SAW filter in which a plurality of IDT electrodes is disposed in the propagation direction of a SAW and ground terminals are separated. The present invention has an advantage in that the attenuation effect of the SAW filter is improved. Furthermore, a skirt characteristic on the high frequency side of a transmission stage and a skirt characteristic on the low frequency side of a reception stage can be improved. Furthermore, an equivalent pass band characteristic can be achieved and a skirt characteristic on the high frequency side and a skirt characteristic on the low frequency side can be improved. Furthermore, the number of bridge electrodes can be reduced and thus a process can be simplified because ground terminals are separated.

12 Claims, 10 Drawing Sheets

(56) References Cited

FOREIGN PATENT DOCUMENTS

| KR | 10-2002-0042495 A | 6/2002 |
|----|-------------------|--------|
| KR | 10-2005-0095028 A | 9/2005 |
| KR | 10-0631412 B1 | 9/2006 |
| KR | 10-2007-0055150 A | 5/2007 |
| KR | 10-2013-0125579 A | 11/2013 |

OTHER PUBLICATIONS

KIPO Office Action, mailed Oct. 13, 2015, for Korean Application No. 10-2014-0134455 which corresponds to the above-referenced U.S. application.

* cited by examiner

FIG.1

RELATED ART

SAW FILTER HAVING GROUND TERMINALS SEPARATED

CROSS REFERENCE TO RELATED APPLICATION

The present application claims the benefit of Korean Patent Application No. 10-2014-0129199 filed in the Korean Intellectual Property Office on Sep. 26, 2014, and the benefit of Korean Patent Application No. 10-2014-0134455 filed in the Korean Intellectual Property Office on Oct. 6, 2014, the entire contents of which are incorporated herein by reference.

BACKGROUND OF THE INVENTION

1. Technical Field

The present invention relates to a surface acoustic wave (SAW) filter having ground terminals separated, in which the ground terminals connected to inter-digital transducer (IDT) electrodes are separated in order to improve the attenuation effect of the frequency of an input electrical signal in the SAW filter in which the IDT electrodes are disposed in the propagation direction of a SAW. Furthermore, the present invention relates to a double mode coupled (DMS) SAW filter having ground terminals separated, which have the same pass band as an existing SAW filter, but can improve a skirt characteristic by increasing the attenuation effect of the DMS SAW filter in such a manner that the configuration of the ground terminals is changed by separating the ground terminals disposed in a SAW filter unit to which a DMS filter unit has been connected in series.

2. Description of the Related Art

In general, a SAW filter is a device produced by applying the characteristics of a SAW, transmitted on a surface of a substrate, as a frequency selection function device. In the SAW filter, a converter of a comb pattern, that is, a metal electrode, is formed in a substrate having a piezo-electric property. When an electric field is applied to the substrate, a surface of the substrate is temporarily twisted. A SAW is generated by such an action. The SAW generated as described above delays an input electrical signal or transmits only a specific frequency signal because it is slower than electromagnetic waves.

In this case, the metal electrode formed on the substrate having a piezo-electric property is called an IDT electrode. The IDT electrode functions to apply an electrical signal to a piezo-electric body and to convert a SAW generated from the piezo-electric body into an electrical signal. Such an IDT electrode is formed by alternately crossing a plurality of electrode fingers in a comb pattern.

The SAW filter includes various types. In particular, a ladder type SAW filter having an excellent skirt characteristic on the high frequency side is chiefly used in the transmission stage of a mobile communication terminal. A DMS SAW filter having an excellent skirt characteristic on the low frequency side of a pass band is chiefly used in the reception stage of a mobile communication terminal.

If the size of such a conventional SAW filter is reduced, it is difficult to obtain an attenuation effect. Accordingly, there is a problem in that a skirt characteristic on the high frequency side of a transmission stage or a skirt characteristic on the low frequency of a reception stage is deteriorated.

PRIOR ART DOCUMENT

Patent Document (Patent Document 1) 10-2005-0095028

SUMMARY OF THE INVENTION

An object of the present invention is to improve the attenuation effect of a SAW filter.

Another object of the present invention is to improve a skirt characteristic on the high frequency side of a transmission stage or a skirt characteristic on the low frequency side of a reception stage.

Yet another object of the present invention is to improve a skirt characteristic on the high frequency side and a skirt characteristic on the low frequency side while achieving an equivalent pass band characteristic.

In an embodiment, a SAW filter in which a plurality of IDT electrodes is disposed in the propagation direction of a SAW and ground terminals are separated may include a first IDT electrode configured to have one side connected to a first resonator and the other side connected to a first ground terminal, a second IDT electrode disposed in a portion adjacent to the first IDT electrode and configured to have one side connected to a second ground terminal and the other side connected to an output terminal, a third IDT electrode disposed in a portion adjacent to the first IDT electrode and configured to have one side connected to the second ground terminal and the other side connected to the output terminal, a fourth IDT electrode disposed in a portion adjacent to the second IDT electrode and configured to have one side connected to the first resonator and the other side connected to the second ground terminal, a fifth IDT electrode disposed in a portion adjacent to the third IDT electrode and configured to have one side connected to the first resonator and the other side connected to the first ground terminal, the first resonator configured to have one side connected to the first IDT electrode and the other side connected to an input terminal, and a second resonator configured to have one side connected to the first resonator and the other side connected to the first ground terminal.

The first resonator may include a serial resonator.

The second resonator may include a parallel resonator.

A first reflector may be disposed in a portion adjacent to the fourth IDT electrode.

The first reflector may be connected to the second ground terminal.

A second reflector may be disposed in a portion adjacent to the fifth IDT electrode.

The second reflector may be connected to the first ground terminal.

The SAW filter may further include a third resonator configured to have one side connected to the second IDT electrode and the third IDT electrode and the other side connected to the input terminal.

In another embodiment, a DMS surface acoustic wave (SAW) filter in which a plurality of inter-digital transducer (IDT) electrodes is disposed in the propagation direction of a SAW and ground terminals are separated may include an input terminal configured to receive an electrical signal, a first DMS filter unit electrically connected to the input terminal and configured to convert a converted SAW into an electrical signal in response to the electrical signal received from the input terminal, a second DMS filter unit electrically connected to the first DMS filter unit and configured to convert the converted SAW into an electrical signal in response to the electrical signal received from the first DMS filter unit, and an output terminal electrically connected to the second DMS filter unit and configured to output the electrical signal received from the second DSM filter unit.

The first DMS filter unit may include a first IDT electrode configured to have one side connected to a first ground terminal and the other side connected to the second DMS filter unit, a second IDT electrode configured to have one side connected to the input terminal and the other side connected to a second ground terminal, a third IDT electrode configured to have one side connected to the input terminal and the other side connected to a second ground terminal, a fourth IDT electrode configured to have one side connected to the second ground terminal and the other side connected to the second DMS filter unit, and fifth IDT electrode configured to have one side connected to the first ground terminal and the other side connected to the second DMS filter unit.

The second DMS filter unit may include a sixth IDT electrode configured to have one side connected to the fifth IDT electrode and the other side connected to the second ground terminal, a seventh IDT electrode configured to have one side connected to the first ground terminal and the other side connected to the output terminal, an eighth IDT electrode configured to have one side connected to the first ground terminal and the other side connected to the output terminal, a ninth IDT electrode configured to have one side connected to the fourth IDT electrode and the other side connected to the second ground terminal, and a tenth IDT electrode configured to have one side connected to the fifth IDT electrode and the other side connected to the first ground terminal.

A first reflector may be disposed in a portion adjacent to the fourth IDT electrode, and a second reflector may be disposed in a portion adjacent to the fifth IDT electrode.

A third reflector may be disposed in a portion adjacent to the ninth IDT electrode, and a fourth reflector may be disposed in a portion adjacent to the tenth IDT electrode.

DETAILED DESCRIPTION

The objects and technical configurations of the present invention and the details of corresponding acting effects will become more clearly understood from the following detailed description.

In a description of embodiments, the meaning that each layer (or film), area, pattern, or structure is formed "over/on" or "under/below" a substrate, layer (or film), area, pad, or pattern includes that it is directly formed "over/on" or "under/below" the substrate, layer (or film), area, pad, or pattern and that it is formed "over/on" or "under/below" the substrate, layer (or film), area, pad, or pattern with a third layer interposed therebetween. A criterion for "over/on or under/below each layer" is based on the figures.

Figure 1:
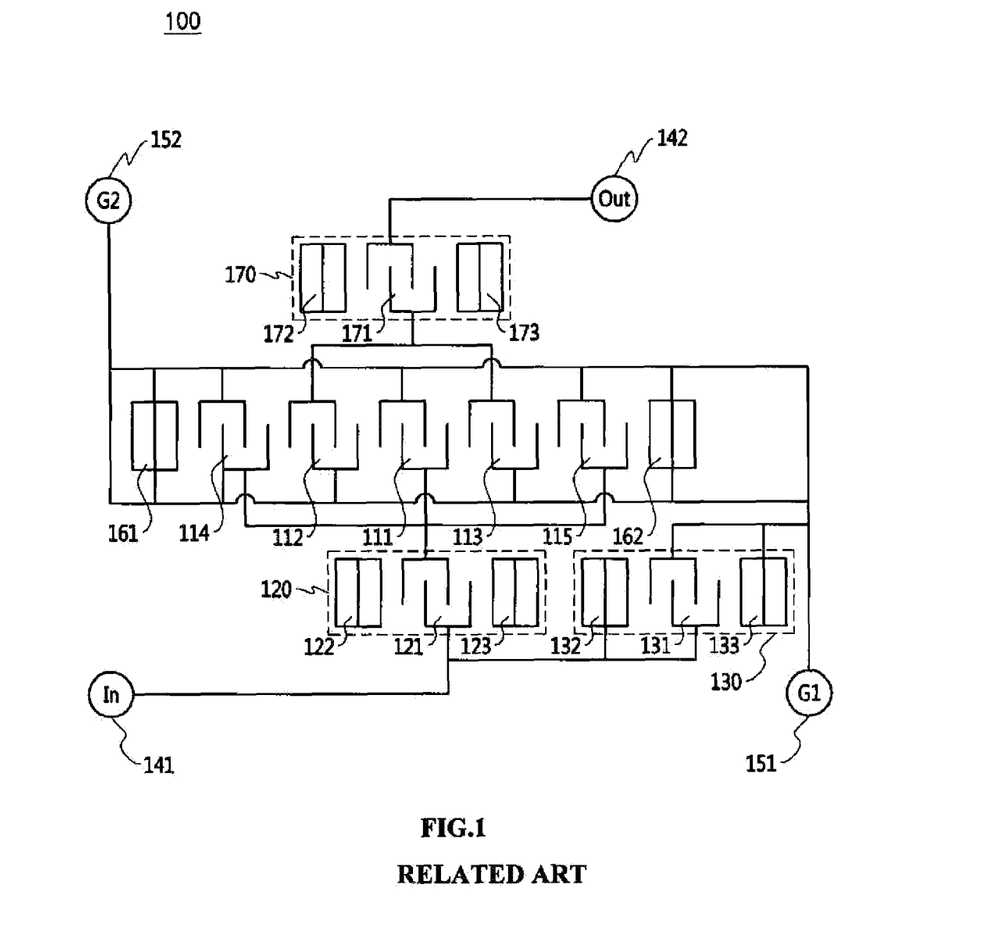
FIG. 1 is a plan view showing a conventional SAW filter.

FIG. 1 is a plan view showing a conventional SAW filter. As shown in FIG. 1, the first resonator 120 of the conventional SAW filter 100 in accordance with an embodiment of the present invention converts a converted SAW into an electrical signal in response to an electrical signal received from an input terminal 141 and sends the converted electrical signal to a first IDT electrode 111.

The first IDT electrode 111 receives the electrical signal from the first resonator 120, converts the converted SAW into an electrical signal in response to the received electrical signal, and sends the converted electrical signal to a second IDT electrode 112 and a third IDT electrode 113 disposed in portions adjacent to the first IDT electrode 111. The second IDT electrode 112 and the third IDT electrode 113 which have received the electrical signals from the first IDT electrode 111 transfer the received electrical signals to an output terminal 142.

In this case, the first resonator 120 which converts the converted SAW into the electrical signal again in response to the electrical signal received from the input terminal 141 sends the converted electrical signal to a fourth IDT electrode 114 and a fifth IDT electrode 115 in addition to the first IDT electrode 111. The fourth IDT electrode 114 which has received the converted electrical signal converts the converted SAW into an electrical signal in response to the electrical signal received from the first resonator 120 and sends the converted electrical signal to the second IDT electrode 112. The second IDT electrode 112 sends the converted SAW to the output terminal 142 in response to the electrical signal received from the first IDT electrode 111 and the electrical signal received from the fourth IDT electrode 114.

Furthermore, the fifth IDT electrode 115 which has received the converted electrical signal from the first resonator 120 converts the converted SAW into an electrical signal again in response to the electrical signal received from the first resonator 120 and sends the converted electrical signal to the third IDT electrode 113. The third IDT electrode 113 sends the converted SAW to the output terminal 142 in response to the electrical signal received from the first IDT electrode 111 and the electrical signal received from the fifth IDT electrode 115.

The first IDT electrode 111, fourth IDT electrode 114, fifth IDT electrode 115, first reflector 161, second reflector 162, and second resonator 130 of the conventional SAW filter 100 are connected to a first ground terminal 151 and a second ground terminal 152 in common.

Figure 2:
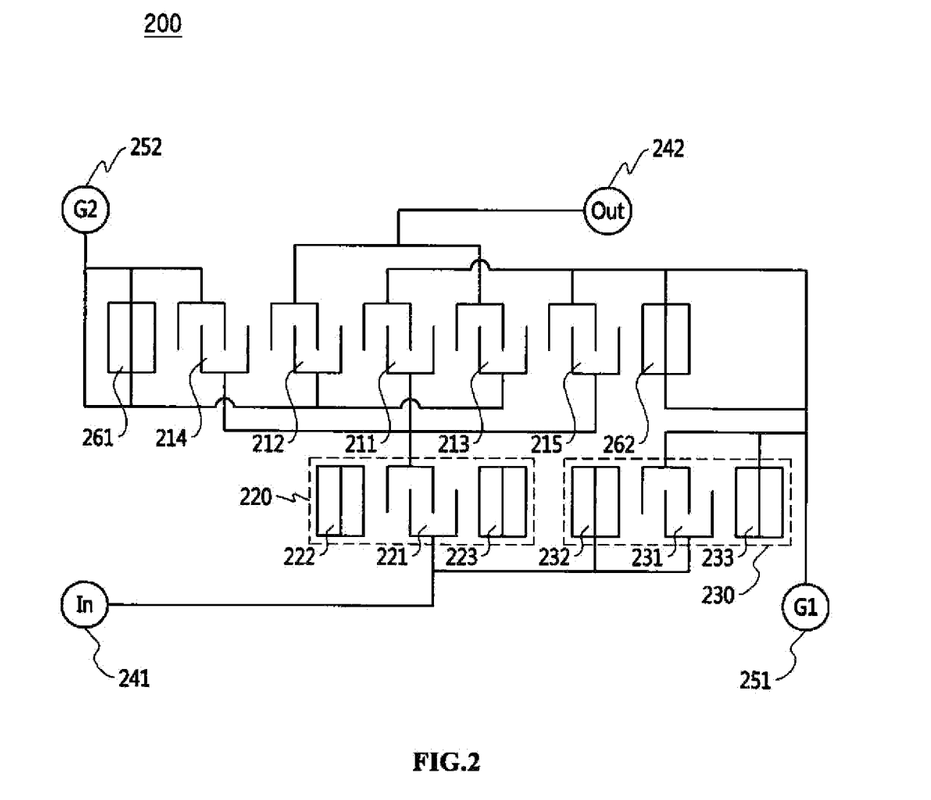
FIG. 2 is a plan view showing a SAW filter having ground terminals separated in accordance with an embodiment of the present invention.

FIG. 2 is a plan view showing a SAW filter having ground terminals separated in accordance with an embodiment of the present invention. As shown in FIG. 2, the SAW filter 200 having ground terminals separated in accordance with an embodiment of the present invention a first IDT electrode 211 configured to have one side connected to a first resonator 220 and the other side connected to a first ground terminal 251, a second IDT electrode 212 disposed in a portion adjacent to the first IDT electrode 211 and configured to have one side connected to a second ground terminal 252 and the other side connected to an output terminal 242, a third IDT electrode 213 disposed in a portion adjacent to the first IDT electrode 211 and configured to have one side connected to the second ground terminal 252 and the other side connected to the output terminal 242, a fourth IDT electrode 214 disposed in a portion adjacent to the second IDT electrode 212 and configured to have one side connected to the first resonator 220 and the other side connected to the second ground terminal 252, a fifth IDT electrode 215 disposed in a portion adjacent to the third IDT electrode 213 and configured to have one side connected to the first resonator 220 and the other side connected to the first ground terminal 251, the first resonator 220 configured to have one side connected to the first IDT electrode 211 and the other side connected to an input terminal 241, and a second resonator 230 configured to have one side connected to the first resonator 220 and the other side connected to the first ground terminal 251.

The first resonator 220 of the SAW filter 200 in accordance with an embodiment of the present invention converts a converted SAW into an electrical signal in response to the electrical signal received from the input terminal 241 and transfer the converted electrical signal to the first IDT electrode 211.

The first IDT electrode 211 receives the electrical signal from the first resonator 220, converts the converted SAW into an electrical signal in response to the received electrical signal, and sends the converted electrical to the second IDT electrode 212 and the third IDT electrode 213 disposed in portions adjacent to the first IDT electrode 211. The second IDT electrode 212 and the third IDT electrode 213 which have received the electrical signals from the first IDT electrode 211 transfer the electrical signals, received from the first IDT electrode 211, to the output terminal 242.

The first resonator 220 which converts the converted SAW into the electrical signal in response to the electrical signal received from the input terminal 241 sends the converted electrical signal to the fourth IDT electrode 214 and the fifth IDT electrode 215 in addition to the first IDT electrode 211. The fourth IDT electrode 214 which has received the converted electrical signal converts the converted SAW into an electrical signal in response to the electrical signal received from the first resonator 220 and sends the converted electrical signal to the second IDT electrode 212. The second IDT electrode 212 sends a converted SAW to the output terminal 242 in response to the electrical signal receive from the first IDT electrode 211 and the electrical signal received from the fourth IDT electrode 214.

Furthermore, the fifth IDT electrode 215 which has received the converted electrical signal from the first resonator 220 converts the converted SAW into an electrical signal in response to the electrical signal received from the first resonator 220 and sends the converted electrical signal to the third IDT electrode 213. The third IDT electrode 213 sends the converted SAW to the output terminal 242 in response to the electrical signal received from the first IDT electrode 211 and the electrical signal received from the fifth IDT electrode 215.

In an embodiment of the present invention, when a DMS filter in which a plurality of IDT electrodes is disposed between reflectors is connected to ground terminals, the IDT electrodes are separated and connected to the ground terminals. Accordingly, an attenuation effect can be improved.

To this end, in the SAW filter in accordance with an embodiment of the present invention, in order to separate the first ground terminal 151 and the second ground terminal 152, the other side of each of the first IDT electrode 211 and the fifth IDT electrode 215 is connected to the first ground terminal 251, and the other side of the fourth IDT electrode 214 is connected to the second ground terminal 252. Furthermore, the first reflector 261 is connected to the second ground terminal 252, and the second reflector 262 is connected to the first ground terminal 251.

The first resonator 220 of the SAW filter 200 in accordance with an embodiment of the present invention may be a serial resonator. The first resonator 220 includes an IDT electrode 221 and reflectors 222 and 223 disposed on both sides of the IDT electrode 221.

The input terminal 241 sends an electrical signal to the second resonator 230 in addition to the first resonator 220. The second resonator 230 may be a parallel resonator. The second resonator 230 includes an IDT electrode 231 and reflectors 232 and 233 disposed on both sides of the IDT electrode 231. In this case, the input terminal 240 is connected to the IDT electrode 231 and reflector 232 of the second resonator 230, that is, a parallel resonator.

In accordance with an embodiment of the present invention, the serial resonator of the SAW filter 200 is used to improve the attenuation effect of a transmission signal. The parallel resonator of the SAW filter 200 is used to improve the attenuation effect of a reception signal.

A first reflector 261 is formed in a portion adjacent to the fourth IDT electrode 214, and a second reflector 262 is formed in a portion adjacent to the fifth IDT electrode 215. The first reflector 261 and the second reflector 262 function to convert converted SAWs into respective electrical signals in response to electrical signals received from the IDT electrodes 214 and 215 respectively adjacent to the first reflector 261 and the second reflector 262 and to reflect the converted electrical signals in a center direction (in an embodiment of the present invention, in the direction of the first IDT electrode 211).

Figure 3:
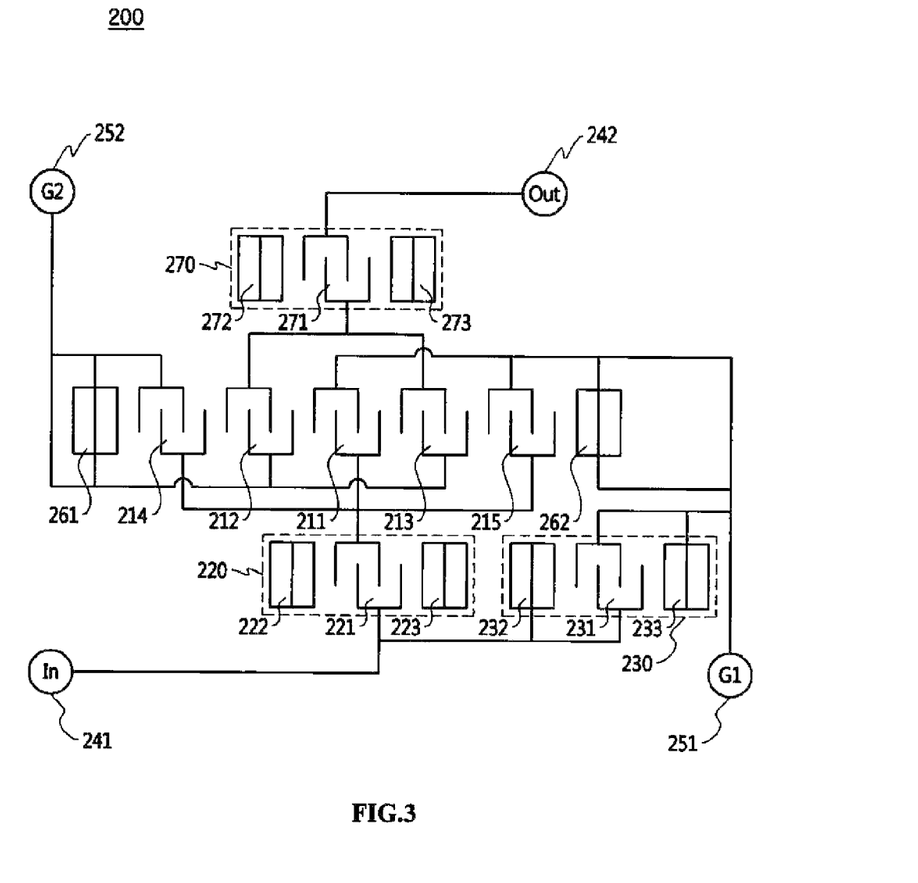
FIG. 3 is a plan view showing a SAW filter having ground terminals separated in accordance with another embodiment of the present invention.

FIG. 3 is a plan view showing a SAW filter having ground terminals separated in accordance with another embodiment of the present invention. As shown in FIG. 3, the SAW filter in accordance with another embodiment of the present invention may further include a third resonator 270 configured to have one side connected to the second IDT electrode 212 and the third IDT electrode 213 and the other side connected to the output terminal 242. In this case, the third resonator 270 may be formed of a serial resonator. The third resonator 270 includes an IDT electrode 271 and reflectors 272 and 273 disposed on both sides of the IDT electrode 271.

If the third resonator 270 is further included in the SAW filter 200, the second IDT electrode 212 is connected to the IDT electrode 271 of the third resonator 270. The second IDT electrode 212 converts an input SAW into an electrical signal and sends the electrical signal to the IDT electrode 271 of the third resonator 270. The third IDT electrode 213 is connected to the IDT electrode 271 of the third resonator 170. The third IDT electrode 213 converts an input SAW into an electrical signal and transfer the electrical signal to the IDT electrode 271 of the third resonator 270.

The third resonator 270 which has received the electrical signals from the second IDT electrode 212 and the third IDT electrode 213 as described above converts a converted SAW into an electrical signal in response to the received electrical signals and sends the converted electrical signal to the output terminal 242.

The structure in which the first ground terminal 251 and the second ground terminal 252 are separated and connected to the first to fifth IDT electrodes 211, 212, 213, 214, and 215 is not limited to the SAW filter 200 in accordance with an embodiment of the present invention. In some embodiments, the first ground terminal 251 and the second ground terminal 252 may be separated in various ways with respect to the first to fifth IDT electrodes 211, 212, 213, 214, and 215.

Figure 4:
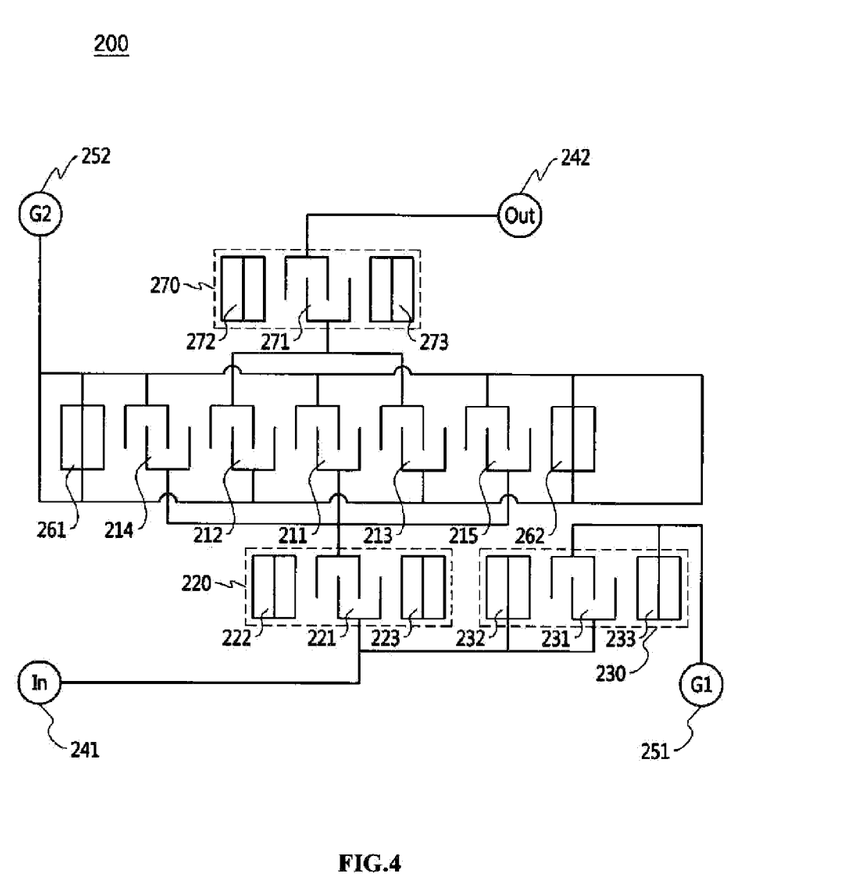
FIG. 4 is a plan view showing a SAW filter having ground terminals separated in accordance with yet another embodiment of the present invention.
Figure 5:
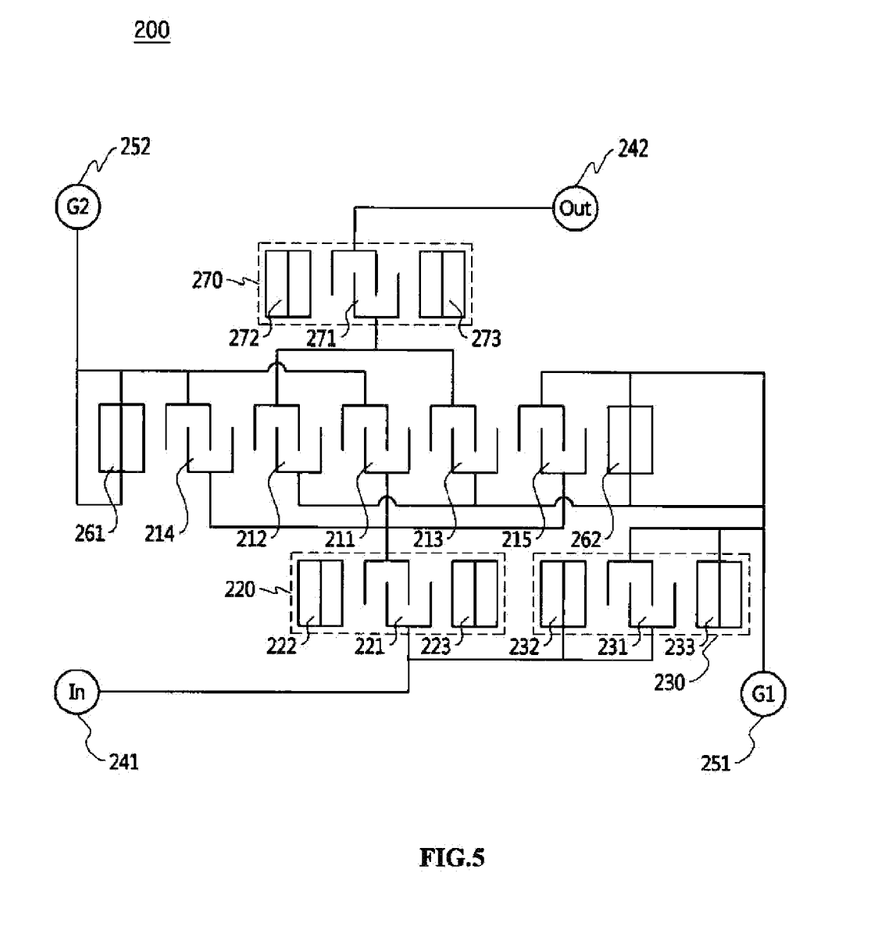
FIG. 5 is a plan view showing a SAW filter having ground terminals separated in accordance with yet another embodiment of the present invention.

FIG. 4 is a plan view showing a SAW filter having ground terminals separated in accordance with yet another embodiment of the present invention, and FIG. 5 is a plan view showing a SAW filter having ground terminals separated in accordance with yet another embodiment of the present invention. The arrangements of IDT electrodes and reflectors in FIGS. 4 and 5 are the same as those of FIG. 3 except electrodes connected to the first ground terminal 251 and the second ground terminal 252. Accordingly, a description of the arrangements of the IDT electrodes and the reflectors is omitted.

Referring to FIG. 4, in the SAW filter in accordance with yet another embodiment of the present invention, the first ground terminal 251 is connected to one side of the IDT electrode 231 and one side of the reflector 233 of the second resonator 230. Furthermore, the second ground terminal 252 is connected to the first reflector 261, connected to one side of the fourth IDT electrode 214, one side of the first IDT electrode 211, one side of the fifth IDT electrode 215, and the second reflector 262, and connected to the other side of the second IDT electrode 212 and the other side of the fourth IDT electrode 214.

Referring to FIG. 5 showing the SAW filter in accordance with yet another embodiment of the present invention, the first ground terminal 251 is connected to the IDT electrode 231 and reflector 233 of the second resonator 230 and is connected to the other side of the second IDT electrode 212, the other side of the third IDT electrode 213, one side of the fifth IDT electrode 215, and the second reflector 262. Furthermore, in FIG. 5, the second ground terminal 252 is connected to the first reflector 261, one side of the fourth IDT electrode 214, and one side of the first IDT electrode 211.

Furthermore, as shown in FIGS. 4 and 5, in the SAW filter in which the first ground terminal 251 and the second ground terminal 252 have been separated, the third resonator 270 may be omitted.

Figure 6:
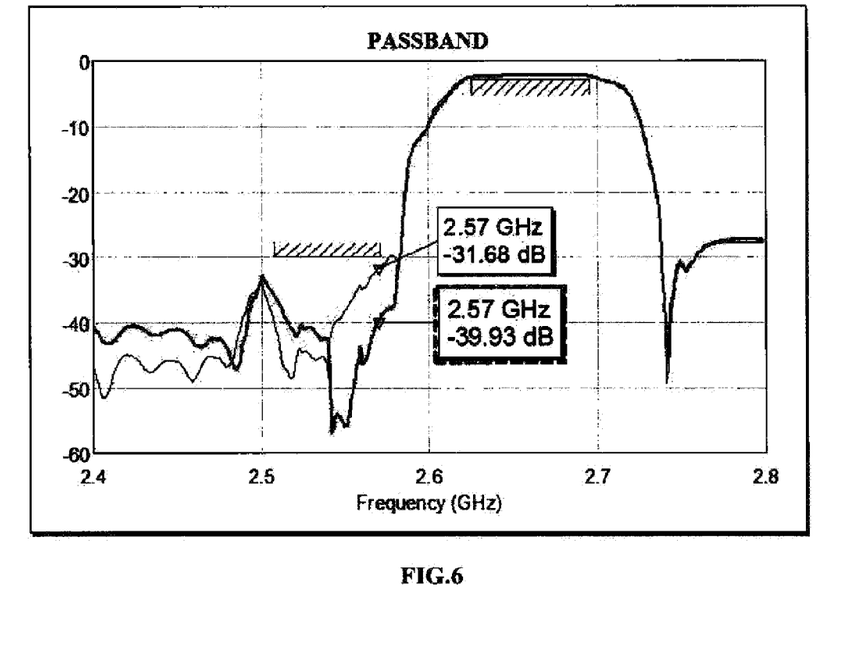
FIG. 6 is a graph showing the simulations of the SAW filter having ground terminals separated in accordance with an embodiment of the present invention.

FIG. 6 is a graph showing the simulations of the SAW filter having ground terminals separated in accordance with an embodiment of the present invention. From FIG. 6, it may be seen that an attenuation effect and a skirt characteristic have been improved compared to the conventional SAW filter 100 having ground terminals connected in common.

Figure 8:
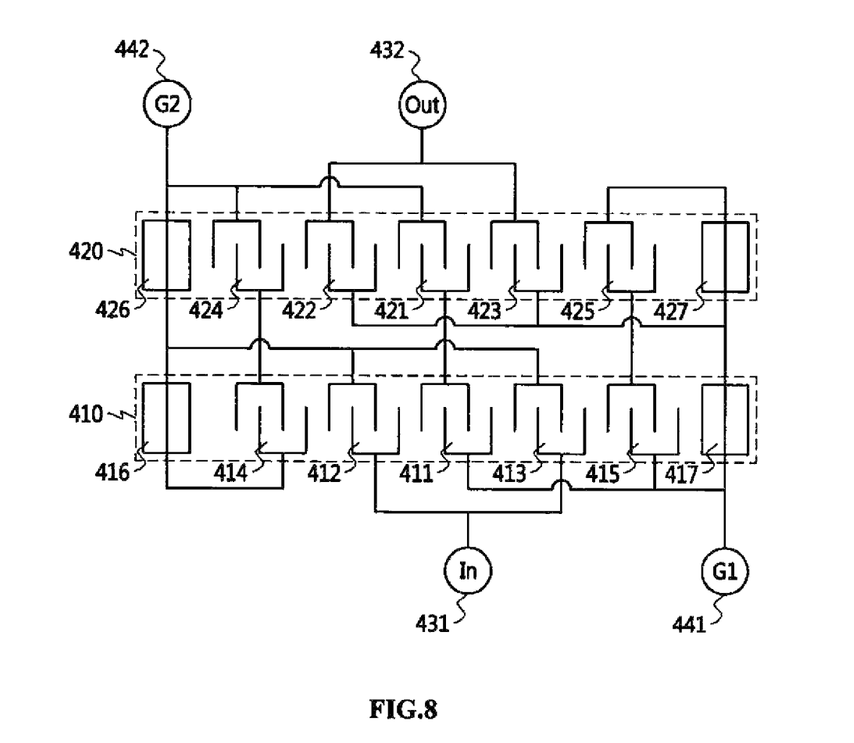
FIG. 8 is a plan view showing a SAW filter having ground terminals separated in accordance with another embodiment of the present invention.
Figure 9:
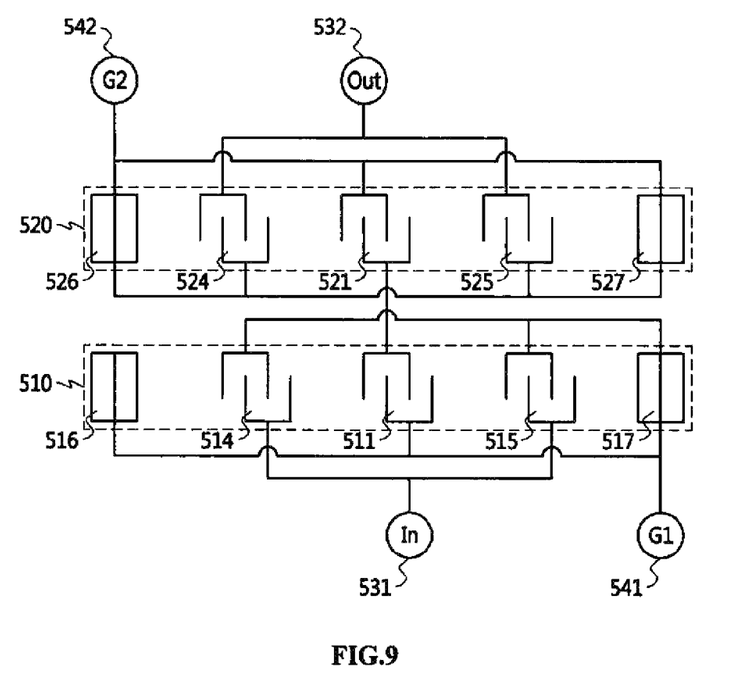
FIG. 9 is a plan view showing a SAW filter having ground terminals separated in accordance with another embodiment of the present invention.
Figure 10:
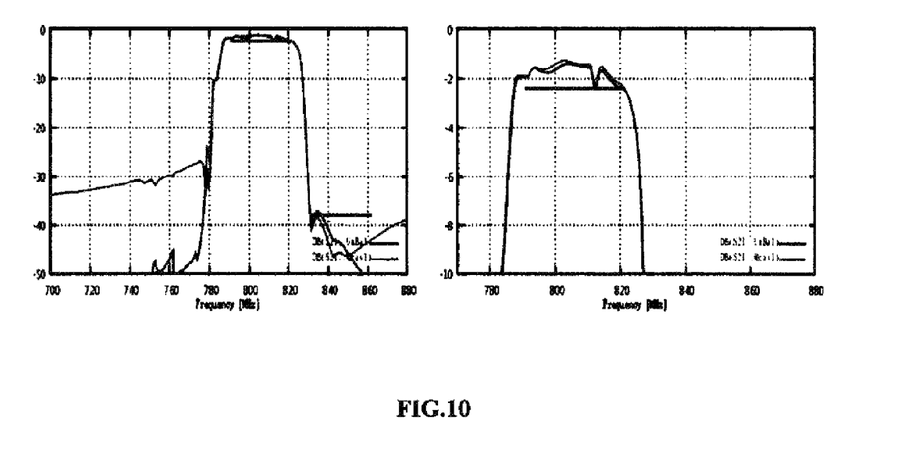
FIG. 10 is a graph showing the output signal of the SAW filter having ground terminals separated in accordance with another embodiment of the present invention.

FIGS. 8, 9, and 10 show DMS SAW filters having ground terminals separated in accordance with other embodiments of the present invention.

Figure 7:
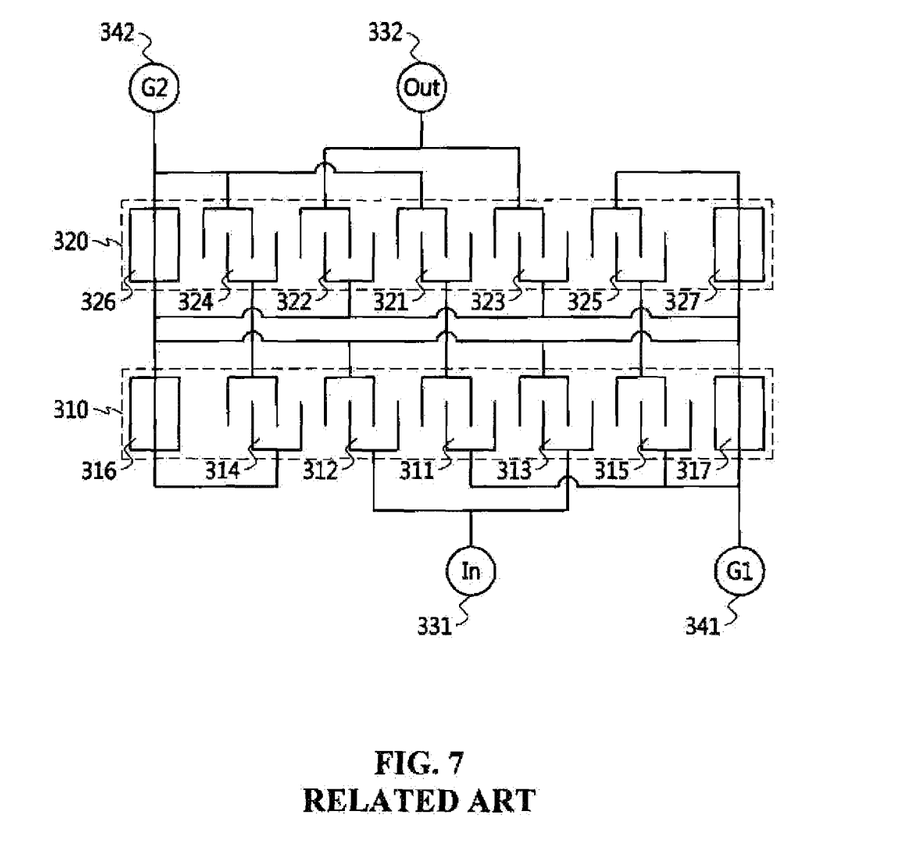
FIG. 7 is a plan view showing a conventional SAW filter.

FIG. 7 is a plan view showing a conventional SAW filter having ground electrodes connected in common. As shown in FIG. 7, in the conventional SAW filter in which a plurality of IDT electrodes and a DMS filter unit having reflectors disposed at both ends thereof are connected in series, a first ground electrode 341 and a second ground electrode 342 connected to IDT electrodes are connected in common.

An electrical signal received from an input terminal 331 is transmitted to the second IDT electrode 312 and third IDT electrode 313 of a first DMS filter unit 310. The second IDT electrode 312 and the third IDT electrode 313 convert converted SAWs into electrical signals in response to the electrical signal received from the input terminal 331. The second IDT electrode 312 sends the converted electrical signal to a fourth IDT electrode 314 and a first IDT electrode 311. The third IDT electrode 313 sends the converted electrical signal to a fifth IDT electrode 315 and the first IDT electrode 311.

The first IDT electrode 311 which has received the electrical signals from the second IDT electrode 312 and the third IDT electrode 313 converts a converted SAW into an electrical signal in response to the received electrical signals and sends the converted electrical signal to the sixth IDT electrode 321 of a second DMS filter unit 320. The sixth IDT electrode 321 which has received the electrical signal from the first IDT electrode 311 of the first DMS filter unit 310 converts a converted SAW into an electrical signal in response to the received electrical signal and sends the converted electrical signal to a seventh IDT electrode 322 and an eighth IDT electrode 323.

In this case, the fourth IDT electrode 314 converts a converted SAW into an electrical signal in response to the electrical signal received from the second IDT electrode 312 and sends the converted electrical signal to a first reflector 316. The first reflector 316 sends the electrical signal to the fourth IDT electrode 314 by reflecting the electrical signal. The fourth IDT electrode 314 sends the electrical signals, received from the second IDT electrode 312 and the first reflector 316, to the ninth IDT electrode 324 of the second DMS filter unit 320. The ninth IDT electrode 324 converts a converted SAW into an electrical signal in response to the received electrical signal and sends the converted electrical signal to the seventh IDT electrode 322. The seventh IDT electrode 322 converts a converted SAW into an electrical signal in response to the received electrical signal and sends the converted electrical signal to an output terminal 332.

The fifth IDT electrode 315 converts a converted SAW into an electrical signal in response to the electrical signal received from the fourth IDT electrode 314 and sends the converted electrical signal to a second reflector 317. The second reflector 317 sends the electrical signal to the fifth IDT electrode 315 by reflecting the electrical signal. The fifth IDT electrode 315 sends the electrical signals, received from the fourth IDT electrode 314 and the second reflector 317, to the tenth IDT electrode 325 of the second DMS filter unit 320. The tenth IDT electrode 325 converts a converted SAW into an electrical signal in response to the received electrical signals and sends the converted electrical signal to the eighth IDT electrode 324. The eighth IDT electrode 324 converts a converted SAW into an electrical signal in response to the received electrical signal and sends the converted electrical signal to the output terminal 332.

The output terminal 332 which has received the electrical signals from the seventh IDT electrode 322 and the eighth IDT electrode 324 as described above outputs the received electrical signals. In such electrical signals, only a signal that belongs to the electrical signal received from the input terminal 331 and that has a required band is subjected to SAW filtering and output.

In this case, one side of the first IDT electrode 311, the other side of the second IDT electrode 312, the other side of the third IDT electrode 314, and the fifth IDT electrode 315 are connected to the first ground electrode 341. The fourth IDT electrode 314 is connected to the first reflector 316. The first reflector 316 is connected to the first ground electrode 341 and a third reflector 326. Furthermore, the other side of each of the seventh IDT electrode 321 and the eighth IDT electrode 323 is connected to the third reflector 326. A fourth reflector 327 is connected to the third reflector 326 and the first ground electrode 341. One side of the third reflector 326 is connected to the second ground electrode 342.

As described above, in the conventional SAW filter, if the IDT electrodes 311, 312, 313, 314, and 315 of the first DMS filter 310 are connected to the first ground electrode 341 and the IDT electrodes 321, 322, 323, 324, and 325 of the second DMS filter 320 are connected to the second ground electrode 342, the first ground electrode 341 and the second ground electrode 342 are connected into one.

FIG. 8 is a plan view showing a SAW filter having ground terminals separated in accordance with another embodiment of the present invention. As shown in FIG. 8, the SAW filter in which a plurality of IDT electrodes has been disposed in the propagation direction of a SAW in accordance with an embodiment of the present invention includes an input terminal 431 configured to receive an electrical signal, a first DMS filter unit 410 electrically connected to the input terminal 431 and configured to convert a converted SAW into an electrical signal in response to an electrical signal received from the input terminal 431, a second DMS filter unit 420 electrically connected to the first DMS filter unit 410 and configured to convert a converted SAW into an electrical signal in response to the electrical signal received from the first DMS filter unit 410, and an output terminal 432 electrically connected to the second DMS filter unit 420 and configured to output an electrical signal received from the second DSM filter unit 420.

The first DMS filter unit 410 includes a first IDT electrode 411 configured to have one side connected to the first ground terminal 441 and the other side connected to the second DMS filter unit 420, a second IDT electrode 412 configured to have one side connected to the input terminal 431 and the other side connected to a second ground terminal 442, a third IDT electrode 413 configured to have one side connected to the input terminal 431 and the other side connected to the second ground terminal 442, a fourth IDT electrode 414 configured to have one side connected to the second ground terminal 442 and the other side connected to the second DMS filter unit 420, and a fifth IDT electrode 415 configured to have one side connected to a first ground terminal 441 and the other side connected to the second DMS filter unit 420.

Furthermore, the second DMS filter unit 420 includes a sixth IDT electrode 421 configured to have one side connected to the fifth IDT electrode 415 and the other side connected to the second ground terminal 442, a seventh IDT electrode 422 configured to have one side connected to the first ground terminal 441 and the other side connected to the output terminal 432, an eighth IDT electrode 423 configured to have one side connected to the first ground terminal 441 and the other side connected to the output terminal 432, a ninth IDT electrode 424 configured to have one side connected to the fourth IDT electrode 414 and the other side connected to the second ground terminal 442, and a tenth IDT electrode 425 configured to have one side connected to the fifth IDT electrode 415 and the other side connected to the first ground terminal 441.

Compared to a conventional DMS SAW filter in which ground terminals are connected into one, the SAW filter in accordance with an embodiment of the present invention has a structure in which the ground terminals are separated.

Referring to FIG. 8, the SAW filter in accordance with an embodiment of the present invention has a structure in which the first DMS filter unit 410 and the second DMS filter unit 420 are connected in series and the IDT electrodes of the first DMS filter unit 410 and the second DMS filter unit 420 are connected to the first ground terminal 441 and the second ground terminal 442.

An electrical signal received from the input terminal 431 is transmitted to the second IDT electrode 412 and the third IDT electrode 413. When the second IDT electrode 412 converts a converted SAW into an electrical signal in response to the electrical signal received from the input terminal 431, the converted electrical signal is transmitted to the first IDT electrode 411 and the fourth IDT electrode 414 disposed in portions adjacent to the second IDT electrode 412. The first IDT electrode 411 converts a converted SAW into an electrical signal in response to the electrical signal received from the second IDT electrode 412 and sends the converted electrical signal to the sixth IDT electrode 421 of the second DMS filter unit 420. The fourth IDT electrode 414 converts a converted SAW into an electrical signal in response to the electrical signal received from the second IDT electrode 412 and sends the converted electrical signal to the ninth IDT electrode 424 of the second DMS filter unit 420 and a first reflector 416.

Furthermore, when the third IDT electrode 413 converts a converted SAW into an electrical signal in response to an electrical signal received from the input terminal 431, the converted electrical signal is transmitted to the first IDT electrode 411 and the fifth IDT electrode 415 disposed in portions adjacent to the third IDT electrode 413. The first IDT electrode 411 converts a converted SAW into an electrical signal in response to the electrical signal received from the third IDT electrode 413 and sends the converted electrical signal to the sixth IDT electrode 421 of the second DMS filter unit 420. In this case, the first IDT electrode 411 converts a converted SAW into an electrical signal in response to the electrical signals from the second IDT electrode 412 and the fourth IDT electrode 414 and sends the converted electrical signal to the sixth IDT electrode 421.

The fifth IDT electrode 415 converts a converted SAW into an electrical signal in response to the electrical signal received from the third IDT electrode 413 and sends the converted electrical signal to the tenth IDT electrode 425 of the second DMS filter unit 420 and a second reflector 417.

The sixth IDT electrode 421 converts a converted SAW into an electrical signal in response to the electrical signal received from the first IDT electrode 411 and sends the converted electrical signal to the seventh IDT electrode 422 and the eighth IDT electrode 423. In this case, the ninth IDT electrode 424 converts a converted SAW into an electrical signal in response to the electrical signal received from the fourth IDT electrode 414 and sends the converted electrical signal to the third reflector 426 and the seventh IDT electrode 422. The seventh IDT electrode 422 transfers the electrical signals, received from the sixth IDT electrode 421 and the ninth IDT electrode 424 as described above, to the output terminal 432.

Furthermore, the tenth IDT electrode 425 converts a converted SAW into an electrical signal in response to the electrical signal received from the fifth IDT electrode 415 and sends the converted electrical signal to a fourth reflector 427 and the eighth IDT electrode 423. The eighth IDT electrode 423 transfers the electrical signals, received from the sixth IDT electrode 421 and the tenth IDT electrode 425 as described above, to the output terminal 432. The output terminal 432 outputs the electrical signals received from the ninth IDT electrode 424 and the tenth IDT electrode 425.

The first reflector 416 and the second reflector 417 are disposed at both ends of the IDT electrodes 411, 412, 413, 414, and 415 of the first DMS filter unit 410. That is, the first reflector 416 is disposed in a portion adjacent to the fourth IDT electrode 414, and the second reflector 417 is disposed in a portion adjacent to the fifth IDT electrode 415. The first reflector 416 and the second reflector 417 function to collect electrical signals, respectively transferred from the IDT electrodes 411, 412, 413, 414, and 415 to both ends of the first DMS filter unit 410, in the direction of the center of the first DMS filter unit 410 (i.e., in the direction of the fourth IDT electrode 414 in the first reflector 416 and in the direction of the fifth IDT electrode 415 in the second reflector 417).

The IDT electrodes 411, 412, 413, 414, and 415 of the first DMS filter unit 410 transfer respective electrical signals to the IDT electrodes 411, 412, 413, 414, and 415 disposed in portions respectively adjacent to the IDT electrodes 411, 412, 413, 414, and 415. The first reflector 416 and the second reflector 417 function to collect the electrical signals, transferred to both ends of the first DMS filter unit 410, in the direction of the center of the first DMS filter unit 410.

Like the first DMS filter unit 410, the second DMS filter unit 420 includes the third and the fourth reflectors 426 and 427 at both ends thereof. The third reflector 426 and the fourth reflector 427 are disposed at both ends of the IDT electrodes 421, 422, 423, 424, and 425 of the second DMS filter unit 420. That is, the third reflector 426 is disposed in a portion adjacent to the ninth IDT electrode 219, and the fourth reflector 427 is disposed in a portion adjacent to the tenth IDT electrode 425. The third reflector 426 and the fourth reflector 427 function to collect electrical signals, respectively transferred from the IDT electrodes 421, 422, 423, 424, and 425 to both ends of the second DMS filter unit 420, in the direction of the center of the second DMS filter unit 420 (i.e., in the direction of the ninth IDT electrode 424 in the third reflector 426 and in the direction of the tenth IDT electrode 425 in the fourth reflector 427).

The IDT electrodes 421, 422, 423, 424, and 425 of the second DMS filter unit 420 transfer respective electrical signals to the IDT electrodes 421, 422, 423, 424, and 425 disposed in portions adjacent to the IDT electrodes 421, 422, 423, 424, and 425. The third reflector 426 and the fourth reflector 427 function to collect the electrical signals, transferred to both ends of the second DMS filter unit 420, in the direction of the center of the second DMS filter unit 420.

IDT electrodes transfer respective electrical signals to IDT electrodes disposed in portions adjacent to the IDT electrodes or a reflector. Accordingly, since the IDT electrodes disposed in the adjacent portions or the reflector continue to transfer electrical signals, a flow of electrical signals in the SAW filter in accordance with an embodiment of the present invention should not be limited the aforementioned flow of electrical signals.

Unlike in a conventional DMS SAW filter, in the DMS SAW filter in accordance with an embodiment of the present invention, ground terminals are separated. In accordance with an embodiment of the present invention, one side of each of the first IDT electrode 411 and fifth IDT electrode 415 of the first DMS filter unit 410 is connected to the first ground terminal 441. One side of each of the seventh IDT electrode 422 and eighth IDT electrode 423 of the second DMS filter unit 420 is connected to the fourth reflector 427. The fourth reflector 427 is connected to the second reflector 417 connected to the first ground terminal 441.

Furthermore, the other side of each of the sixth IDT electrode 421 and ninth IDT electrode 424 of the second DMS filter unit 420 is connected to the second ground terminal 442. The other side of each of the third IDT electrode 413 and second IDT electrode 412 of the first DMS filter unit 410 is connected to the first reflector 416. The first reflector 416 is connected to the third reflector 426 connected to the second ground terminal 442.

The ground terminals 441 and 442 are separated because the other side of the third IDT electrode 413 of the first DMS filter unit 410 is not connected to the other side of the second reflector 417 of the first DMS filter unit 410 and one side of the seventh IDT electrode 422 of the second DMS filter unit 420 is not connected to have the other side of the third reflector 426 as described above. The construction in which the ground terminals are separated as described above can increase the attenuation effect of the SAW filter.

FIG. 9 is a plan view showing a SAW filter having ground terminals separated in accordance with another embodiment of the present invention. As shown in FIG. 9, the DMS SAW filter in which ground terminals have been separated may be applied to a construction in which DMS filter units 510 and 520 each having three IDT electrodes disposed therein are connected in series. In the DMS SAW filter having ground terminals separated in accordance with an embodiment of the present invention, the number of IDT electrodes disposed in each of the DMS filter units 510 and 520 is not limited.

In accordance with another embodiment of the present invention, when an electrical signal is received, the input terminal 531 of the DMS SAW filter transfer the input electrical signal to the second IDT electrode 514 and third IDT electrode 515 of the first DMS filter unit 510. The second IDT electrode 514 converts a converted SAW into an electrical signal in response to the received electrical signal. The third IDT electrode 515 converts a converted SAW into an electrical signal in response to the electrical signal received from the input terminal 531. In this case, a first IDT electrode 511 receives the converted electrical signals from the second IDT electrode 514 and the third IDT electrode 515 and transfers the converted electrical signals to the fourth IDT electrode 521 of the second DMS filter unit 520. The fourth IDT electrode 521 converts a converted SAW into an electrical signal in response to the electrical signal received from the first IDT electrode 511 and sends the converted electrical signal to a fifth IDT electrode 524 and a sixth IDT electrode 525 disposed in portions adjacent to the fourth IDT electrode 521 as described above. The fifth IDT electrode 524 and the sixth IDT electrode 525 which have received the electrical signals from the fourth IDT electrode 521 convert converted SAWs into respective electrical signals in response to the received electrical signals and send the converted electrical signals to an output terminal 532. The output terminal 532 outputs the electrical signals received as described above.

In this case, a first reflector 516 and a second reflector 517 are disposed at both ends of the first DMS filter unit 510, and a third reflector 526 and a fourth reflector 517 are disposed at both ends of the second DMS filter unit 520. The IDT electrodes 511, 514, and 515 of the first DMS filter unit 510 send respective electrical signals to the IDT electrodes 511, 514, and 515 disposed in portions adjacent to the IDT electrodes 511, 514, and 515. The first reflector 516 and the second reflector 517 function to collect the electrical signals, transferred to the both ends of the first DMS filter unit 510, in the direction of the center of the first DMS filter unit 510.

Likewise, the IDT electrodes 521, 524, and 525 of the second DMS filter unit 520 send respective electrical signals to the IDT electrodes 521, 524, and 525 disposed in portions adjacent to the IDT electrodes 521, 524, and 525. The third reflector 526 and the fourth reflector 527 function to collect the electrical signals, transferred to both ends of the second DMS filter unit 520, in the direction of the center of the second DMS filter unit 520.

In this case, one side of the first IDT electrode 511 is connected to a first ground terminal 541, and the other side of each of the second IDT electrode 514 and the third IDT electrode 515 is connected to the second reflector 517 connected to the first ground terminal 541. Furthermore, the other side of the fourth IDT electrode 521 is connected to a second ground terminal 542. One side of each of the fifth IDT electrode 524 and the sixth IDT electrode 525 is connected to a third reflector 526 connected to the second ground terminal 542. Accordingly, the attenuation effect of the SAW filter is increased because the ground terminals 541 and 542 are separated.

FIG. 10 is a graph showing the output signal of the SAW filter having ground terminals separated in accordance with another embodiment of the present invention. As shown in FIG. 10, the SAW filter in accordance with an embodiment of the present invention may have advantages in that an equivalent pass band characteristic is achieved and a skirt characteristic on the high frequency side and a skirt characteristic on the low frequency side are improved.

The present invention has an advantage in that the attenuation effect of the SAW filter can be improved.

Furthermore, the present invention has an advantage in that a skirt characteristic on the high frequency side of a transmission stage and a skirt characteristic on the low frequency side of a reception stage can be improved.

Furthermore, the present invention may have an advantage in that an equivalent pass band characteristic can be achieved and a skirt characteristic on the high frequency side and a skirt characteristic on the low frequency side can be improved.

Furthermore, the present invention may have advantages in that the number of bridge electrodes can be reduced and thus a process can be simplified because ground terminals are separated.

As described above, those skilled in the art to which the present invention pertains will understand that the present invention may be implemented in other detailed forms without changing the technical spirit or essential characteristics of the present invention. Accordingly, the aforementioned embodiments should not be construed as being limitative, but should be construed as being only illustrative from all aspects.

What is claimed is:

1. A surface acoustic wave (SAW) filter in which a plurality of inter-digital transducer (IDT) electrodes is disposed in a propagation direction of a SAW and ground terminals are separated, the SAW filter comprising:
    a first IDT electrode configured to have a first side connected to a first resonator and a second side connected to a first ground terminal;
    a second IDT electrode disposed in a portion adjacent to the first IDT electrode and configured to have a first side connected to a second ground terminal and a second side connected to an output terminal;
    a third IDT electrode disposed in a portion adjacent to the first IDT electrode and configured to have a first side connected to the second ground terminal and a second side connected to the output terminal;
    a fourth IDT electrode disposed in a portion adjacent to the second IDT electrode and configured to have a first side connected to the first resonator and a second side connected to the second ground terminal;
    a fifth IDT electrode disposed in a portion adjacent to the third IDT electrode and configured to have a first side connected to the first resonator and a second side connected to the first ground terminal;
    the first resonator configured to have a first side connected to the first IDT electrode and a second side connected to an input terminal; and
    a second resonator configured to have a first side connected to the first resonator and a second side connected to the first ground terminal.

2. The SAW filter of claim 1, wherein the first resonator comprises a serial resonator.

3. The SAW filter of claim 1, wherein the second resonator comprises a parallel resonator.

4. The SAW filter of claim 1, wherein a first reflector is disposed in a portion adjacent to the fourth IDT electrode.

5. The SAW filter of claim 4, wherein the first reflector is connected to the second ground terminal.

6. The SAW filter of claim 4, wherein a second reflector is disposed in a portion adjacent to the fifth IDT electrode.

7. The SAW filter of claim 6, wherein the second reflector is connected to the first ground terminal.

8. The SAW filter of claim 1, further comprising a third resonator configured to have a first side connected to the second IDT electrode and the third IDT electrode and a second side connected to the output terminal.

9. A double mode coupled (DMS) surface acoustic wave (SAW) filter in which a plurality of inter-digital transducer (IDT) electrodes is disposed in a propagation direction of a SAW and ground terminals are separated, the DMS SAW filter comprising:
    an input terminal configured to receive an electrical signal;
    a first DMS filter unit electrically connected to the input terminal and configured to convert a converted SAW into an electrical signal in response to the electrical signal received from the input terminal;
    a second DMS filter unit electrically connected to the first DMS filter unit and configured to convert the converted SAW into an electrical signal in response to the electrical signal received from the first DMS filter unit; and
    an output terminal electrically connected to the second DMS filter unit and configured to output the electrical signal received from the second DMS filter unit,
    wherein the first DMS filter unit comprises:
    a first IDT electrode configured to have a first side connected to a first ground terminal and a second side connected to the second DMS filter unit;
    a second IDT electrode configured to have a first side connected to the input terminal and a second side connected to a second ground terminal;
    a third IDT electrode configured to have a first side connected to the input terminal and a second side connected to the second ground terminal;
    a fourth IDT electrode configured to have a first side connected to the second ground terminal and a second side connected to the second DMS filter unit; and
    a fifth IDT electrode configured to have a first side connected to the first ground terminal and a second side connected to the second DMS filter unit.

10. The DMS SAW filter of claim 9, wherein the second DMS filter unit comprises:

a sixth IDT electrode configured to have a first side connected to the fifth IDT electrode and a second side connected to the second ground terminal;
a seventh IDT electrode configured to have a first side connected to the first ground terminal and a second side connected to the output terminal;
an eighth IDT electrode configured to have a first side connected to the first ground terminal and a second side connected to the output terminal;
a ninth IDT electrode configured to have a first side connected to the fourth IDT electrode and a second side connected to the second ground terminal; and
a tenth IDT electrode configured to have a first side connected to the fifth IDT electrode and a second side connected to the first ground terminal.

11. The DMS SAW filter of claim 9, wherein:
a first reflector is disposed in a portion adjacent to the fourth IDT electrode, and
a second reflector is disposed in a portion adjacent to the fifth IDT electrode.

12. The DMS SAW filter of claim 11, wherein:
a third reflector is disposed in a portion adjacent to the ninth IDT electrode, and
a fourth reflector is disposed in a portion adjacent to the tenth IDT electrode.

* * * * *